US009608611B1

(12) United States Patent
Hearne et al.

(10) Patent No.: US 9,608,611 B1
(45) Date of Patent: Mar. 28, 2017

(54) PHASE INTERPOLATOR AND METHOD OF IMPLEMENTING A PHASE INTERPOLATOR

(71) Applicant: Xilinx, Inc., San Jose, CA (US)

(72) Inventors: Catherine Hearne, Fermoy (IE); Parag Upadhyaya, Los Gatos, CA (US); Kevin Geary, Ballincollig (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/009,462

(22) Filed: Jan. 28, 2016

(51) Int. Cl.
*H03H 11/16* (2006.01)
*H03K 5/135* (2006.01)
*H03K 5/00* (2006.01)

(52) U.S. Cl.
CPC ... *H03K 5/135* (2013.01); *H03K 2005/00052* (2013.01)

(58) Field of Classification Search
None
See application file for complete search history.

(56) References Cited

U.S. PATENT DOCUMENTS

| 6,597,212 | B1* | 7/2003 | Wang | H03K 5/13 327/117 |
| 7,298,195 | B2* | 11/2007 | Freyman | H03C 3/225 327/234 |
| 7,425,856 | B2* | 9/2008 | Abel | H03K 5/13 327/231 |
| 7,750,707 | B2* | 7/2010 | Momtaz | H03H 11/02 327/231 |
| 7,764,091 | B2* | 7/2010 | Jiang | H03B 28/00 327/129 |
| 7,913,104 | B1 | 3/2011 | Cory et al. | |
| 8,170,150 | B2* | 5/2012 | Singh | H03K 5/135 330/253 |
| 8,995,514 | B1 | 3/2015 | Asuncion et al. | |
| 9,065,601 | B1 | 6/2015 | Jenkins et al. | |
| 2005/0227660 | A1* | 10/2005 | Hashemi | H01Q 3/22 455/276.1 |
| 2014/0334583 | A1* | 11/2014 | Lee | H04L 25/0272 375/362 |

OTHER PUBLICATIONS

Frans, Yohan et al., "A 0.5-16.3 Gb/s Fully Adaptive Flexible-Reach Transceiver for FPGA in 20 nm CMOS," IEEE Journal of Solid-State Ciircuits, Aug. 2015, pp. 1932-1944, vol. 50, No. 8, IEEE, Piscataway, New Jersey, USA.

* cited by examiner

*Primary Examiner* — Cassandra Cox
(74) *Attorney, Agent, or Firm* — John J. King

(57) ABSTRACT

A phase interpolator implemented in an integrated circuit to generate a clock signal is described. The phase interpolator comprises a plurality of inputs coupled to receive a plurality of clock signals; a plurality of transistor pairs, each transistor pair having a first transistor coupled to a first output node and a second transistor coupled to a second output node, wherein a first clock signal associated with the transistor pair is coupled to a gate of the first transistor and an inverted first clock signal associated with the transistor pair is coupled to a gate of the second transistor; a first active inductor load coupled to the first output node; and a second active inductor load coupled to the second output node.

16 Claims, 8 Drawing Sheets

PHASE INTERPOLATOR AND METHOD OF IMPLEMENTING A PHASE INTERPOLATOR

TECHNICAL FIELD

The present invention relates generally to integrated circuit devices, and in particular, to a phase interpolator and a method of implementing a phase interpolator.

BACKGROUND

The transmission of data is an important function enabled by integrated circuits. A phase interpolator, which is sometimes referred to as a mixer, is a key component of a clock and data recovery (CDR) circuit. A CDR circuit implements a control loop that can adjust the data sampling clock to sample the data at the center of the data eye. The linearity of the phase interpolator is a key component in determining the CDR system performance. An analog current mode logic (CML) phase interpolator receives differential CML quadrature clocks and mixes them together in a controlled ratio to generate an output clock that has a controlled phase offset from the differential CML quadrature clocks. The phase of the output clock can cover a full 360 degree rotation.

A phase interpolator can be implemented to cover a wide range of input frequencies, such as between 2 GHz and 18 GHz. A phase interpolator can use different programmable power consumption settings that usually relate to the operating frequency, where higher operating frequencies generally require higher power to achieve the necessary bandwidth (i.e. gain at the output of the CML stage). The traditional load for CML phase interpolator is a passive resistor. However, the use of a passive resistor load in a phase interpolator has a number of drawbacks.

Accordingly, circuits and methods that implement a phase interpolator that provides greater bandwidth and lower power consumption are beneficial.

SUMMARY

A phase interpolator implemented in an integrated circuit to derive a clock signal is described. The phase interpolator comprises a plurality of inputs coupled to receive a plurality of clock signals; a plurality of transistor pairs, each transistor pair having a first transistor coupled to a first output node and a second transistor coupled to a second output node, wherein a first clock signal associated with the transistor pair is coupled to a gate of the first transistor and an inverted first clock signal associated with the transistor pair is coupled to a gate of the second transistor; a first active inductor load coupled to the first output node; and a second active inductor load coupled to the second output node.

A method of implementing a phase interpolator in an integrated circuit to derive a clock signal is also described. The method comprises implementing a plurality of transistor pairs, each transistor pair having a first transistor coupled to a first output node and a second transistor coupled to a second output node; configuring a first active inductor load between a reference voltage and the first output node; configuring a second active inductor load between the reference voltage and the second output node; coupling, for each transistor pair, a first clock signal of a plurality of clock signals and associated with the transistor pair to a gate of the first transistor; coupling, for each transistor pair, an inverted first clock signal to a gate of the second transistor; and generating an output clock signal based upon the plurality of clock signals.

Other features will be recognized from consideration of the Detailed Description and the Claims, which follow.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods set forth below implement an active inductor load for an analog CML phase interpolating cell and can yield significantly lower power consumption for similar linearity performance compared to conventional analog CML phase interpolators having a linear load provided by a resistor. The circuits and methods also can provide higher bandwidth and lower jitter. The circuits and methods also provide comparable linearity performance over a range of programmable power consumption settings/operating frequencies for broadband operation compared to conventional analog CML phase interpolators having a linear load provided by a resistor. Improved linearity is provided by gm-pair segmentation and zero location control, and is improved with respect to an active inductor load solution without these features. The overall linearity itself with gm-pair segmentation and zero location control is comparable to that of the resistive load solution.

The circuits and methods provide constant current biasing for the current in the phase interpolator, in contrast to constant voltage (i.e. swing) biasing used for conventional devices using a resistive load. Swing size for the active inductor of the various implementations is reasonably maintained over process, voltage and temperature variations as the gain of the cell is based upon a ratio of the p-type metal oxide semiconductor (PMOS) and the n-type metal oxide semiconductor (NMOS) transconductance ($g_m$).

The circuits and methods also use gm-pair segmentation to create a constant $g_m$ over a range of operating currents in a phase interpolating cell having an active inductor load. The gm-pair segmentation is important in achieving linearity.

A programmable capacitor between a gate of the active inductor transistor device and a supply voltage is used to control the size of the effective inductance generated. The size of this capacitor, and hence the effective inductance of the active inductor, can be digitally controlled.

Figure 1:
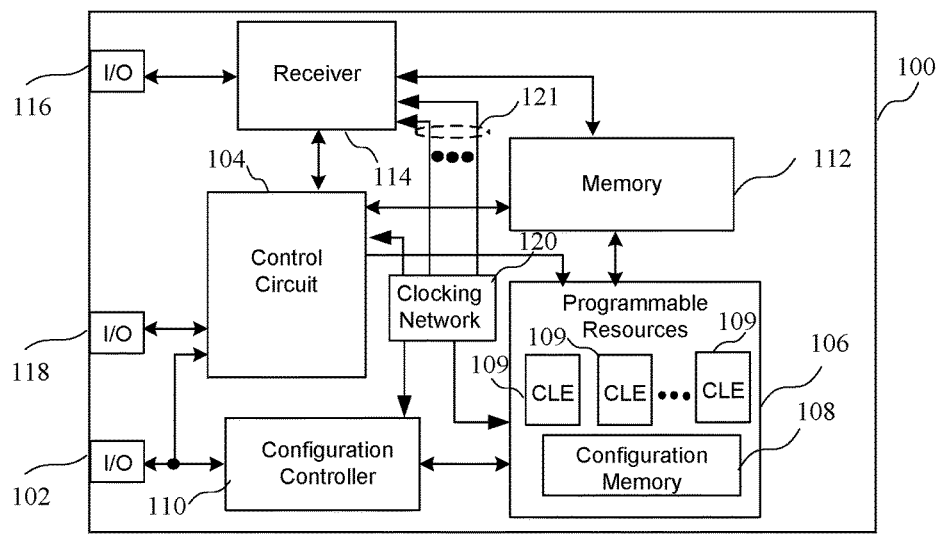
FIG. 1 is a block diagram of an integrated circuit 100 comprising a receiver circuit implementing phase interpolators.

Turning first to FIG. 1, a block diagram of an integrated circuit 100 comprising a receiver circuit implementing phase interpolators as described in FIGS. 2-10 is shown. In particular, an input/output port 102 is coupled to a control circuit 104 that controls programmable resources 106 having configuration memory 108. Configuration data may be provided to the configuration memory 108 by a configuration controller 110. The configuration data enables the operation of configurable logic elements 109. A memory may be coupled to the control circuit 104 and the programmable resources 106. A receiver circuit 114 may be coupled to the control circuit 104, programmable resources 106 and the memory 112, and may receive signals at the integrated circuit by way of I/O port 116. Other I/O ports may be coupled to circuits of the integrated circuit device, such as I/O port 118 that is coupled to the control circuit 104 as shown. A clocking network 120 is coupled to various elements of the circuit of FIG. 1 and provide clock signals to the receiver 114 at inputs 121. The circuits and methods of implementing a phase interpolator described in more detail below may be implemented by various elements of the circuit of FIG. 1, and particularly the receiver circuit 114 for transmitting data in parallel.

Figure 2:
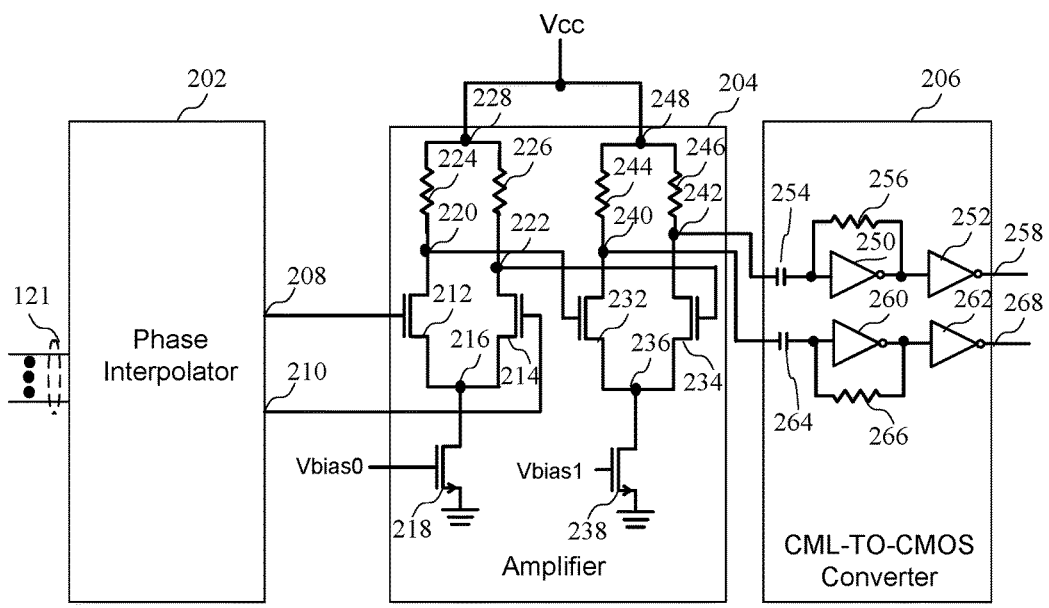
FIG. 2 is a block diagram of a circuit including a phase interpolator as implemented in the integrated circuit of FIG. 1.

Turning now to FIG. 2, a block diagram of a circuit having a phase interpolator 202 as implemented in the integrated circuit of FIG. 1 is shown. The phase interpolator 202 is coupled to an amplifier 204, which may be a limiting amplifier implemented as a CML stage, and a CML-to-CMOS converter 206. The amplifier 204 is coupled to receive outputs of the phase interpolator generated at outputs 208 and 210, and comprises a first stage having a first transistor 212 coupled in parallel with a second transistor 214 at a node 216. A transistor 218 is coupled to the node 216 and provides a current path between the node 216 and a ground (GND) potential. The gate of transistor 218 receives a bias voltage (Vbias0) that controls the current in the transistor. The first stage further comprises a resistor 224 coupled between a node 220 and a node 228 coupled to the reference voltage Vcc, and a second resistor 226 coupled between a node 222 and the node 228. The amplifier 204 also comprises a second stage having a first transistor 232 coupled in parallel with a second transistor 234 at a node 236. A transistor 238 is coupled to the node 236 and provides a current path between the node 236 and a ground (GND) potential. The gate of the transistor 238 receives a bias voltage (Vbias1) that controls the current in the transistor. The second stage further comprises a resistor 244 coupled between a node 240 and a node 228 coupled to the reference voltage Vcc, and a second resistor 246 coupled between a node 242 and the node 248. The outputs 220 and 222 are coupled to gates of the transistors 232 and 234, respectively. Output nodes 240 and 242 are coupled to the drains of transistors 232 and 234 at a first terminal of resistors 244 and 246, respectively. A second terminal of resistors 244 and 246 are coupled to a node 248 at the reference voltage Vcc.

The CML-to-CMOS converter 206 comprises a first inverter 250 having an input coupled to a capacitor 254 at the output 242, where an output of the inverter 250 is coupled to an inverter 252. A resistor 256 is coupled across the inputs and outputs of the inverter 260. A first output is generated at an output 258. A second inverter 260 having an input coupled to a capacitor 264 at the output 240, where an output of the inverter 260 is coupled to an inverter 262. A resistor 266 is coupled across the inputs and outputs of the inverter 260. A second output is generated at an output 268. While examples of the amplifier 204 and the CML-to-CMOS converter 206, it should be understood that other circuits could be implemented for the amplifier and CML-to-CMOS converter.

Figure 3:
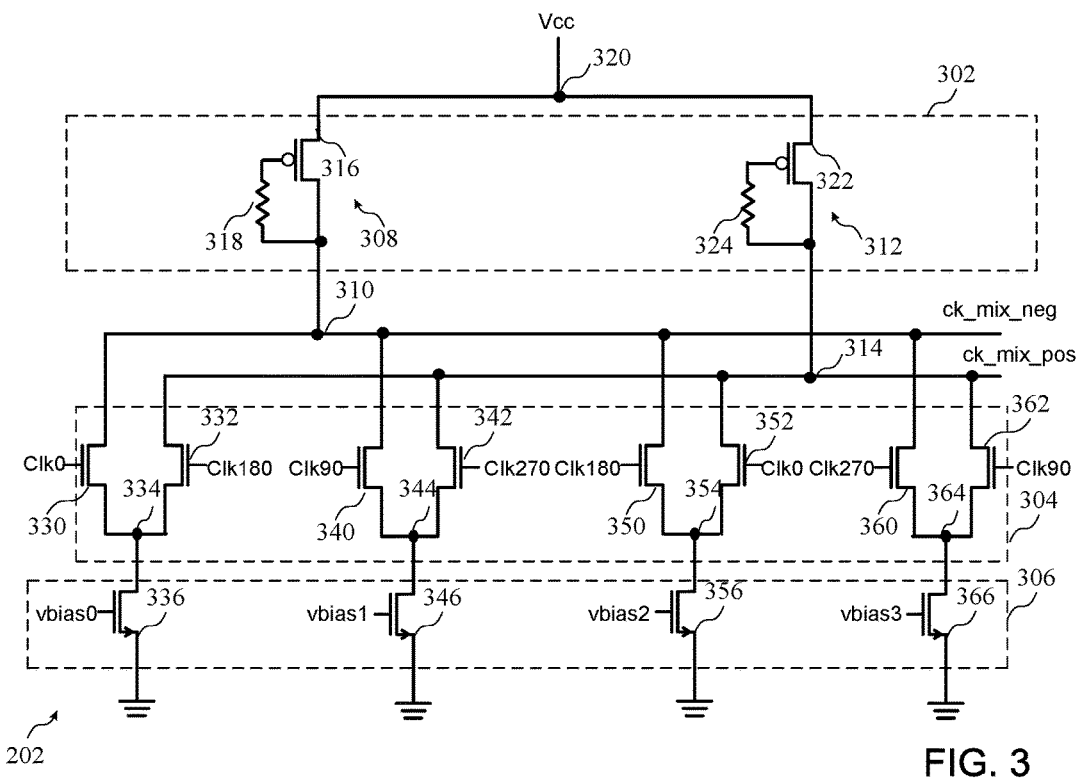
FIG. 3 is a block diagram of a phase interpolator having an active load.

Turning now to FIG. 3, a block diagram of a phase interpolator 202 having an active inductor load is shown. The phase interpolator 202 comprises a load 302 coupled to output nodes of a plurality of transconductance pairs of a mixer block 304, where each of the plurality of transconductance pairs is controlled by a current sink of a current sink block 306. More particularly, a first active load 308 is coupled to a first output node 310 for generating a first clock signal (ck_mix_neg) of a pair of differential output clock signals, while a second active load 312 is coupled to a second output node 314 for generating a second clock signal (ck_mix_neg) of the pair of differential output clock signals.

The first active load comprises a P-channel transistor 316 having a resistor 318 coupled between a gate and a current node of the transistor 316, shown here as a drain of the P-channel transistor 316. A source of the transistor 316 is coupled to a node 320, which is a reference voltage (Vcc) node. The second active load comprises a P-channel transistor 322 having a resistor 324 coupled between a gate and a current node of the transistor 322, shown here as drain of the transistor 322. A source of the transistor 322 is coupled to the node 320. While P-channel transistors are shown in the active loads 308 and 312, it should be understood that N-channel transistors could be used also, as will be described in more detail below. When implementing N-channel transistors, the resistor 318 would be coupled between the gate and the source of the transistor 316, and the resistor 324 would be coupled between the gate and the source for the transistor 322. When implementing an active load using N-channel transistors the gm-pair and current sink transistors must also switch from NMOS transistors to PMOS transistors.

The first and second clock signals are based upon phases of a clock signal coupled to gates of transistors of the plurality of transconductance pairs. More particularly, a first transconductance pair includes transistors 330 and 332, each having a source coupled to a node 334, which is coupled to a transistor 336 operating as a current sink. A drain of the transistor 330 is coupled to the node 310, and is configured to receive the Clk0 signal at the gate of the transistor 330. A drain of the transistor 332 is coupled to the node 314, and is configured to receive the Clk180 clock at a gate of the transistor 332.

A second transconductance pair includes transistors 340 and 342, each having a source coupled to a node 344, which is coupled to a transistor 346 operating as a current sink. A drain of the transistor 340 is coupled to the node 310, and is configured to receive the Clk90 signal at the gate of the transistor 340. A drain of the transistor 342 is coupled to the node 314, and is configured to receive the Clk270 clock at a gate of the transistor 342.

A third transconductance pair includes transistors 350 and 352, each having a source coupled to a node 354, which is coupled to a transistor 356 operating as a current sink. A drain of the transistor 350 is coupled to the node 310, and is configured to receive the Clk180 signal at the gate of the transistor 350. A drain of the transistor 352 is coupled to the node 314, and is configured to receive the Clk0 clock at a gate of the transistor 352.

A fourth transconductance pair includes transistors 360 and 362, each having a source coupled to a node 364, which is coupled to a transistor 366 operating as a current sink. A drain of the transistor 360 is coupled to the node 310, and is configured to receive the Clk270 signal at the gate of the transistor 360. A drain of the transistor 362 is coupled to the node 314, and is configured to receive the Clk90 clock at a gate of the transistor 362. The bias voltages vbias0, vbias1, vbias2, and vbias3 are controlled to provide the desired contributions of the clock signals Clk0, Clk90, Clk180 and Clk270, which are different phases of a reference clock signal, to generate the desired phase of the differential output signals ck_mix_neg and ck_mix_pos.

The active inductor load as implemented in the circuit of FIG. 3 can be used to either extend the bandwidth of the phase interpolator cell (compared to a conventional phase interpolator cell having a resistive load) or use lower tail current to achieve the same bandwidth as a conventional phase interpolator cell having a resistive load, but with lower power. The active inductor creates this by introducing frequency peaking to the transfer function of the cell. The zero is created by adding resistance between the gate and drain of the active inductor PMOS device and the parasitic capacitance between the gate and source of the active inductor PMOS device. This capacitance can be augmented by adding a capacitive device between the gate and source of the active inductor PMOS device, as will be described in more detail in reference to FIG. 6. Noise and jitter reduction is achieved due the ability to design the active inductor to have lower gain at frequencies below the operating frequency of the phase interpolator compared to a conventional phase interpolator cell having a resistive load, thereby suppressing the low frequency noise components while achieving larger bandwidth to reduce jitter amplification.

Figure 4:
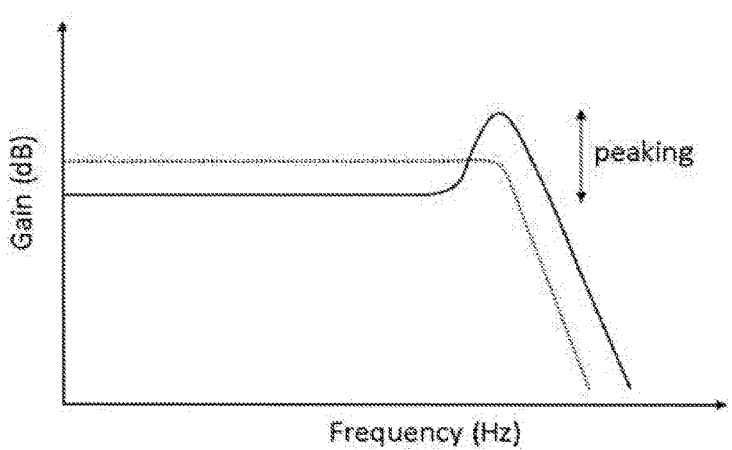
FIG. 4 is a frequency response curve showing gain as a function of frequency for the circuit of FIG. 3.

Turning now to FIG. 4, a frequency response curve shows gain of a CML stage controlled by a phase interpolator as a function of frequency for the circuit of FIG. 3. In general, the use of a phase interpolator having an active inductor (shown in the solid line) results in more bandwidth (i.e. as indicated by the greater gain in FIG. 4) compared to a phase interpolator having a passive resistor device (shown in the dashed line) when biased with the same current and driving the same capacitive load. As the tail current is reduced, the gm-pair size can also be reduced in order maintain roughly the same biasing position (and hence linearity) for a given amplifier design. Therefore, the gm-pair forms a significant portion of the capacitive load, and it was possible to achieve even more power saving. It should be noted that not all of the gain in bandwidth was given over the power saving, but that a portion of it may be maintained to slightly increase the signal swing size (compared to the resistive load solution), where the swing size is increased (particularly at higher frequencies) at both the phase interpolator output and limiting amplifier output. Increased swing size at the CML-to-CMOS converter reduces the impact of AM to PM conversion, which can degrade linearity.

AM to PM conversion, in this case related to phase interpolation operation, can occur if amplitude of the signal at the mixer output varies with PI code (that is the code that is used to set the level of mixing/output phase required) and a subsequent processing block in the signal chain exhibits different signal propagation delays for different input amplitudes. In the circuit of FIG. 3, the primary block to exhibit this sensitivity is the CML-to-CMOS converter. The varying propagation delay is in effect an additional unwanted phase shift corrupting the linearity of the mixing operation. This unwanted error is generally worse for smaller signal amplitudes and can be almost negligible after the signal reaches a certain amplitude level, which is dependent on the characteristics of the block in question. Therefore, using the active inductor to slightly increase the bandwidth of the signal (i.e. the signal amplitude) results in less AM to PM conversion effects in subsequent blocks in the signal chain. This active inductor solution whose greater bandwidth allows for slightly larger signal amplitude, and therefore mitigates against AM to PM conversion.

Figure 5:
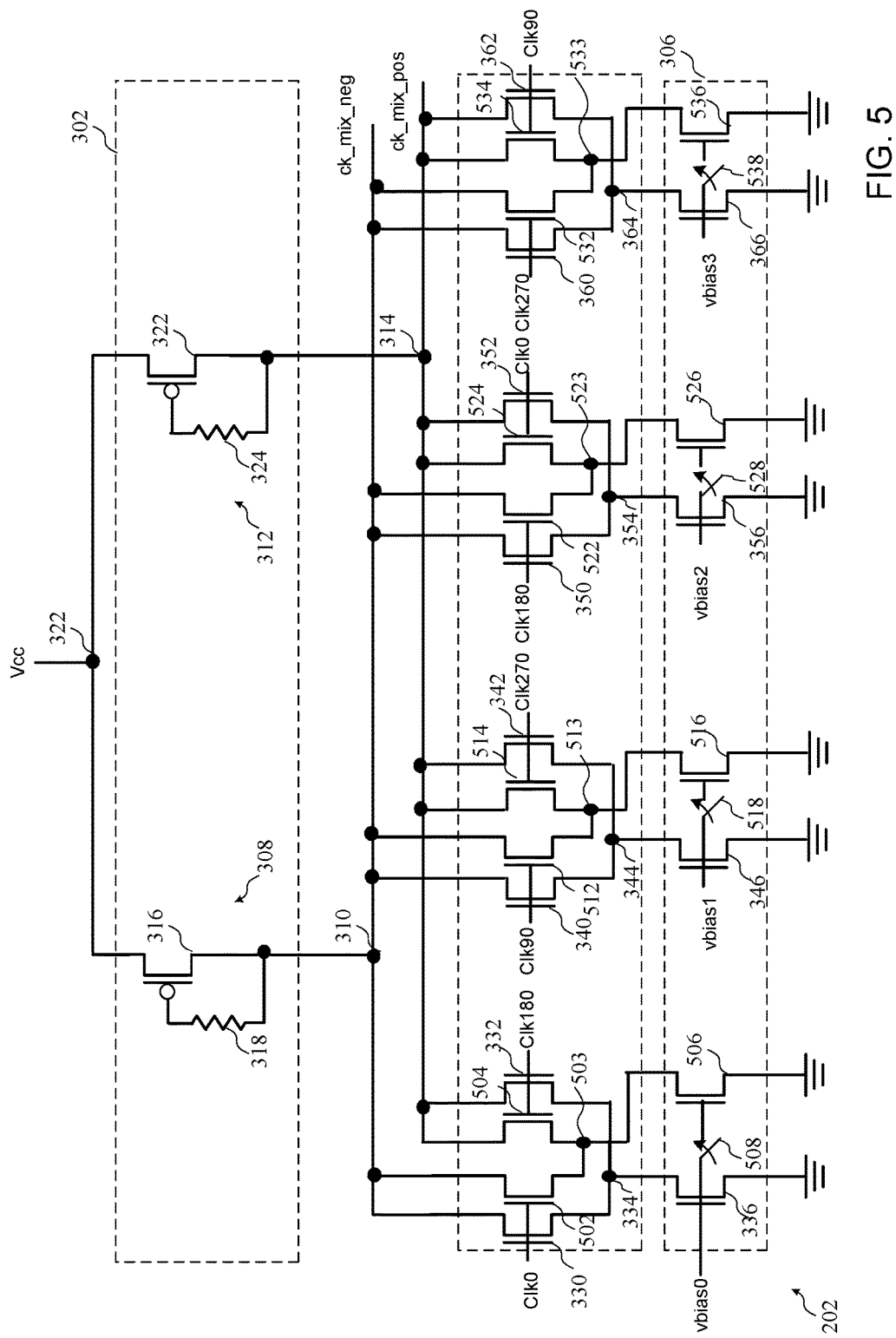
FIG. 5 is a block diagram of a phase interpolator having an active load, current sink scaling, and gm-pair segmentation.

Turning now to FIG. 5, a block diagram of a phase interpolator having an active load, current sink scaling, and gm-pair segmentation is shown. As shown in FIG. 5, a transistor is coupled in parallel for each transistor of the transconductance pair, where the additional transistor can be used to provide additional current in the transconductance pair by way of a corresponding current sink transistor in the current sink block 306. More particularly, a transistor 502 is coupled between the node 310 and a node 503, and a transistor 504 is coupled between the node 314 and the node 503. The transistors 502 and 504 receive the Clk0 and Clk180 at their respective gates. A current sink transistor 506 coupled between the node 503 and ground. A gate of the current sink transistor 506 is coupled to a switch 508 that enable applying vbias0 to the gate of transistor 506. The switch 508 can selectively provide a current path for transistors 502 and 504.

A transistor 512 is coupled between the node 310 and a node 513, and a transistor 514 is coupled between the node 314 and the node 513. The transistors 512 and 514 receive the Clk90 and Clk270 at their respective gates. A current sink transistor 516 coupled between the node 513 and ground. A gate of the current sink transistor 516 is coupled to a switch 518 that enables applying vbias1 to the gate of transistor 516, and therefore provide a current path for transistors 512 and 514.

A transistor 522 is coupled between the node 310 and a node 523, and a transistor 524 is coupled between the node 314 and the node 523. The transistors 522 and 524 receive the Clk180 and Clk270 at their respective gates. A current sink transistor 526 coupled between the node 523 and ground. A gate of the current sink transistor 526 is coupled to a switch 528 that enable applying vbias2 to the gate of transistor 526, and therefore provide a current path for transistors 522 and 524.

Finally, a transistor 532 is coupled between the node 310 and a node 533, and a transistor 534 is coupled between the node 314 and the node 533. The transistors 532 and 534 receive the Clk270 and Clk90 at their respective gates. A current sink transistor 536 coupled between the node 533 and ground. A gate of the current sink transistor 536 is coupled to a switch 538 that enable applying vbias3 to the gate of transistor 536, and therefore provide a current path for transistors 532 and 534.

The benefit of using gm-pair segmentation as shown in FIG. 5 is improved linearity, and particularly in the case where the phase interpolator is required to operate over a wide range of clock frequencies each with different power consumption settings. Maintaining constant overdrive voltage on the gm-pair devices improves linearity. The higher the VOD (where overdrive voltage=Vgs−Vt) of the gm-pair, the more linear the amplifier. The amount of current that the gm-pair is required to conduct modulates the source voltage (Vs) (assuming at fixed common mode on the input signal (Vg) at the gate and hence directly the VOD) and therefore affects the linearity of the stage. The tail current is programmable with frequency (to reduce power consumption for lower line rates), and the gm-pair is usually designed with the highest current in mind to give the best linearity at the highest operating frequency. Therefore, when the operating frequency drops, the current reduces and hence the VOD reduces and hence linearity degrades. The segmentation approach to the gm-pair of FIG. 5 counteracts this by reducing the size of the gm-pair devices in use for a given tail current, and hence maintains constant VOD and thereby improves the linearity. By providing separate tail current branches that feed a segment, a corresponding portion of the gm pair can be automatically powered down, thereby reducing the effective width of the overall gm-pair and hence maintaining constant VOD with reduced tail current.

When a current sink segment is powered down (via connecting its gate to a low voltage) the corresponding gm-pair segment also powers down, as it no longer receives current, the current in the active gm-pairs in increased and hence the overdrive voltage (i.e. desired operating point) is maintained. This technique improves the linearity of the phase interpolation for lower power settings.

The digital control of the capacitor allows the tuning of the peak frequency of the active inductor transfer function to be close the operating frequency as will be described in reference to FIG. 6, also improving the linearity for lower frequencies of operation.

Figure 6:
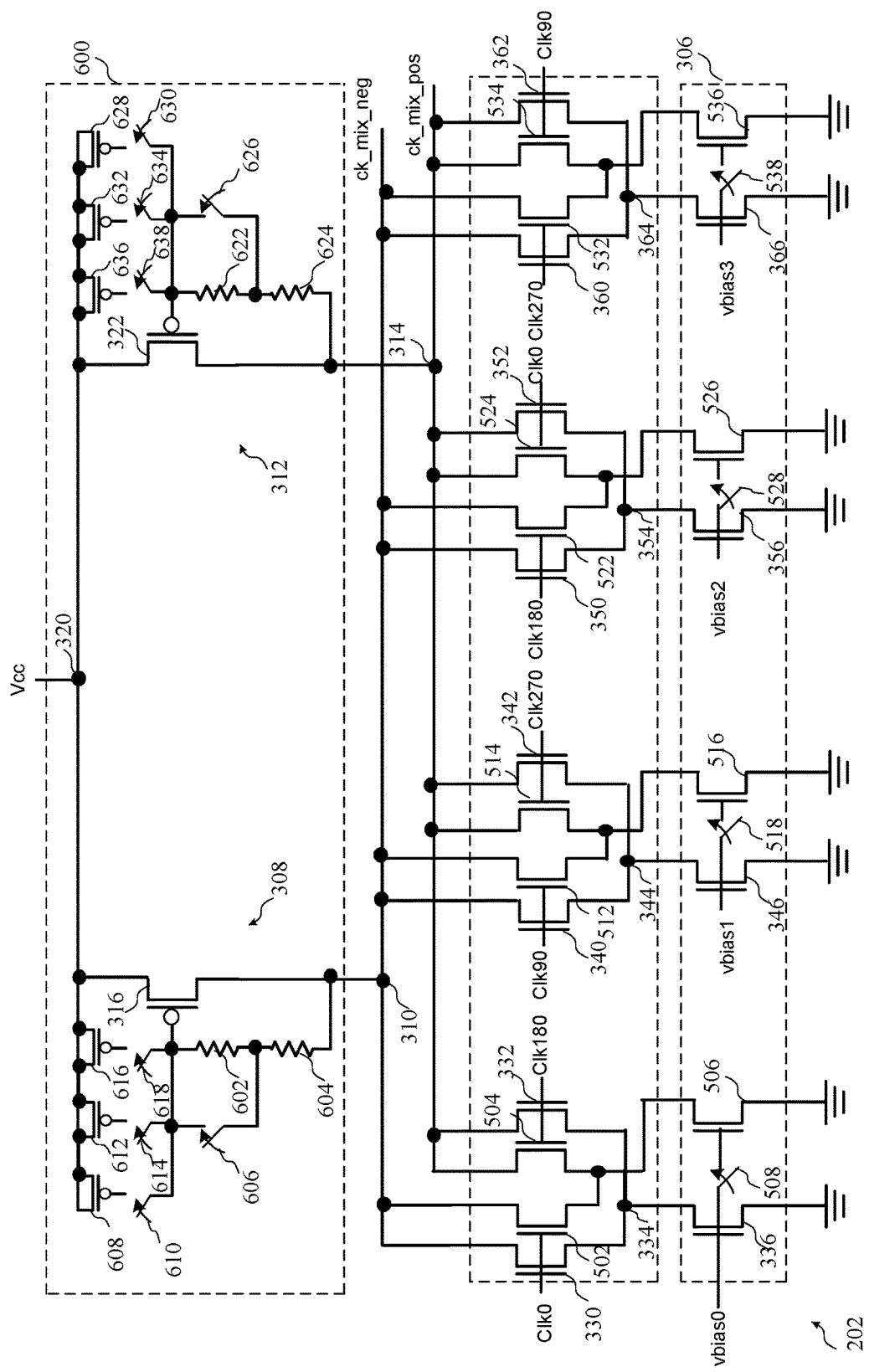
FIG. 6 is a block diagram of a phase interpolator having an active load with capacitive and resistive control.

Turning now to FIG. 6, a block diagram of a phase interpolator having an active load with capacitive and resistive control is shown. The circuit of FIG. 6 uses a digitally controlled capacitor size to control the zero location (peaking frequency) of the CML phase interpolator with the active inductor load. In addition to the elements of FIG. 5, the load 600 comprises active loads having programmable capacitors. In particular, the resistive element between the gate of transistor 316 and the node 310 comprises a first resistor 602 and a second resistor 604, where a switch 606 enables selecting the resistance between the gate of transistor 316 and the node 310 by enabling bypassing the resistor 602. In addition to any parasitic capacitance between the gate and source of transistor 316, additional capacitance can be provided by selectively switching out one or more capacitors, where each capacitor has one terminal coupled to the gate of the transistor 316 and the other terminal coupled to the source of transistor 316 at the node 320. A first capacitor 608 may be coupled between the node 320 and the gate of the transistor 316 by a switch 610. A second capacitor 612 may be coupled between the node 320 and the gate of the transistor 316 by a switch 614. A third capacitor 616 may be coupled between the node 322 and the gate of the transistor 316 by a switch 618. Three capacitors are shown here by way of example, where the capacitors 608, 612, and 616 could be transistors having their sources and drains each connected together at the node 322.

Similarly, the resistive element between the gate of transistor 322 and the node 314 comprises a first resistor and a second resistor 624, where a switch 626 enables selecting the resistance between the gate and the node 310 by enabling bypassing the resistor 622. In addition to any parasitic capacitance between the gate and source of transistor 322, additional capacitance can be provided by selectively switching out one or more capacitors, where each capacitor has one terminal coupled to the gate of the transistor 322 and the other terminal coupled to the source of transistor 322 at the node 320. A first capacitor 628 may be coupled between the node 320 and the gate of the transistor 322 by a switch 630. A second capacitor 632 may be coupled between the node 320 and the gate of the transistor 322 by a switch 634. A third transistor 636 may be coupled between the node 332 and the gate of the transistor 322 by a switch 638. While the circuit of FIG. 6 includes the elements of FIG. 5, it should be noted that the load 600 having active loads with programmable capacitors could be implemented in the circuit of FIG. 3.

The benefit of using capacitive control for the zero location is that it is smaller than a solution employing only resistive control. Further, it is easier to tune than a solution employing only resistive control and is programmable to implement multiple settings. It also gives fine tuning resolution. While the gate-drain device capacitance of the active inductor MOS device itself may be sufficiently large enough when combined with the appropriate resistor between gate and drain of the active inductor MOS device to form a zero at the required frequency, one or more additional capacitors provides additional flexibility in establishing a zero location. The addition of a separate device capacitance allows for shifting the peaking frequency to lower frequencies without increasing the resistor between gate and drain of the active inductor MOS device. Therefore, the one or more additional capacitors in the embodiment of FIG. 6 is an enhancement to the active inductor. Alternatively, the value of the resistor could be increased to shift the peaking frequency to lower frequencies.

The circuit of FIG. 6 uses constant current biasing for the current in the phase interpolator in contrast to constant voltage (swing) biasing used in conventional devices having a resistive load. Swing size for the active inductor implementation of FIG. 6 is reasonably maintained over process, voltage and temperature variations, as the gain of the cell is a ratio of the PMOS and NMOS gm. The active inductor is tunable by varying bias current (which is achieved when the tail current is scaled with line rate) and varying the zero location of the active inductor and therefore the frequency at which the gain peaks (which is achieved via adjusting the capacitance between gate and source of the active inductor PMOS device and feedback resistor). Optimum linearity for a given line rate occurs when the peak frequency of CML stage is close to the operating frequency. The ability to tune/program the location of the peak with respect to the line rate therefore improves the linearity. Tuning via bias current alone may not be sufficient to maintain linearity for the lower line rates where the peak frequency could be far above the operating frequency, and hence there could be significant gain at the second harmonic and possibly third harmonic which would cause signal distortion. Ideally, to maintain linearity the input signals to the mixer would be sine waves (i.e. no harmonic components). As the preceding stages to the mixer in the clock distribution scheme are generally limiting amplifiers, there can be significant harmonic content particularly at lower frequencies where the bandwidth is more than sufficient.

Figure 7:
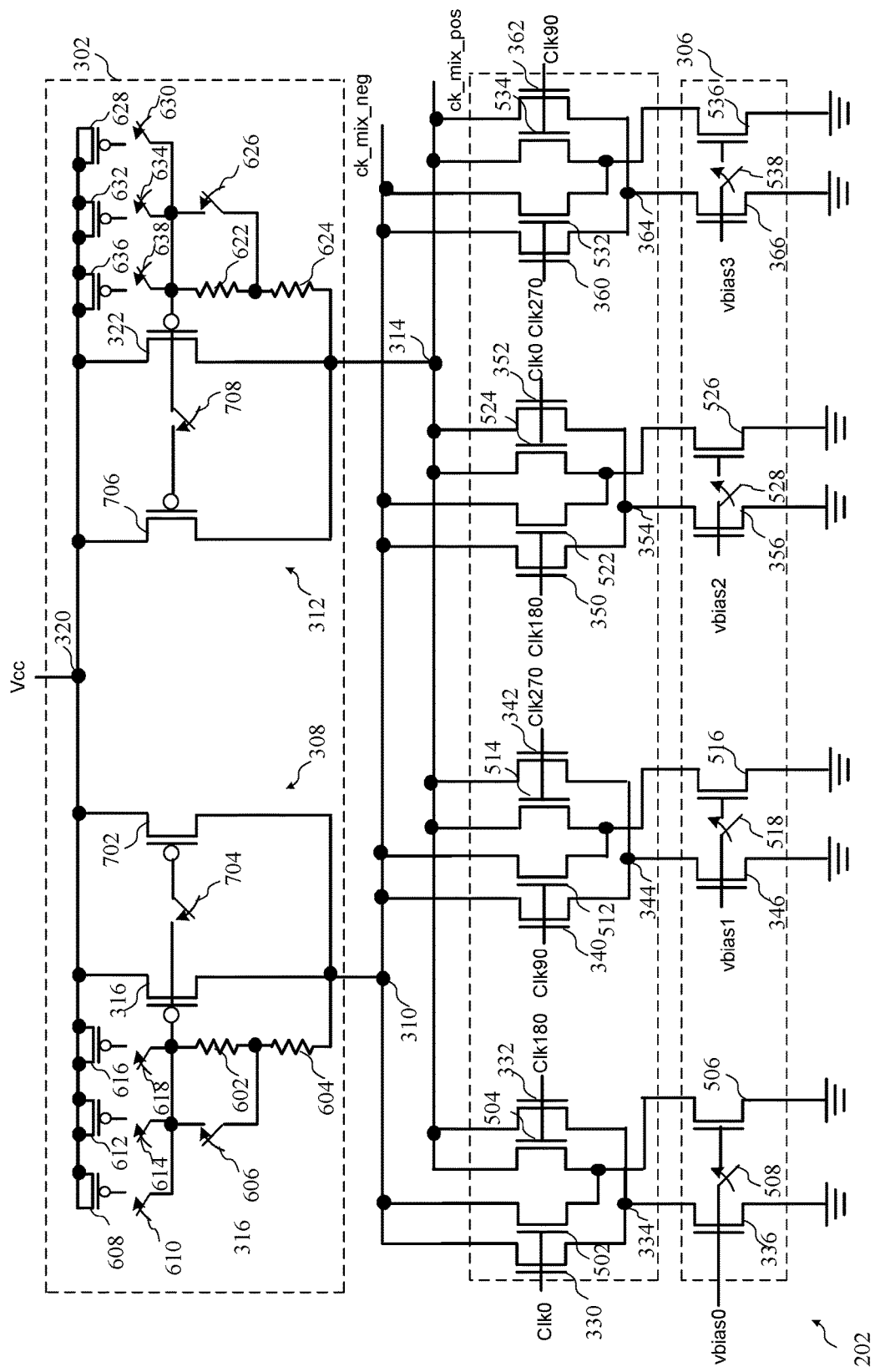
FIG. 7 is a block diagram of a phase interpolator having an active load with capacitive and resistive control and active inductor size scaling employed in conjunction with the current sink scaling.

Turning now to FIG. 7, a block diagram of a phase interpolator having an active load with capacitive and resistive control and active inductor scaling in conjunction with the current sink scaling is shown. In addition to the elements of FIG. 6, an additional transistor 702 controlled by a switch 704 is coupled in parallel with the transistor 316. The transistor 702 controls the current through the transistor 316. Similarly, an additional transistor 706 controlled by a switch 708 is coupled in parallel with the transistor 322. The transistor 706 controls the current through the transistor 322. When a controllable switch associated with a transconductance pair of the current sink block 306 is closed, an increased current will be supplied to the active inductor. In FIG. 6 the size of the inductor device itself does not change with changing tail current in the current sink block. Rather, it is sized to suit the biggest current at high operating frequencies. Therefore, as tail current changes, the signal common mode changes. The implementation of FIG. 7 enables tuning the size of the active inductor device for each specific tail current setting, and therefore enables creating a constant common mode for the signal.

Figure 8:
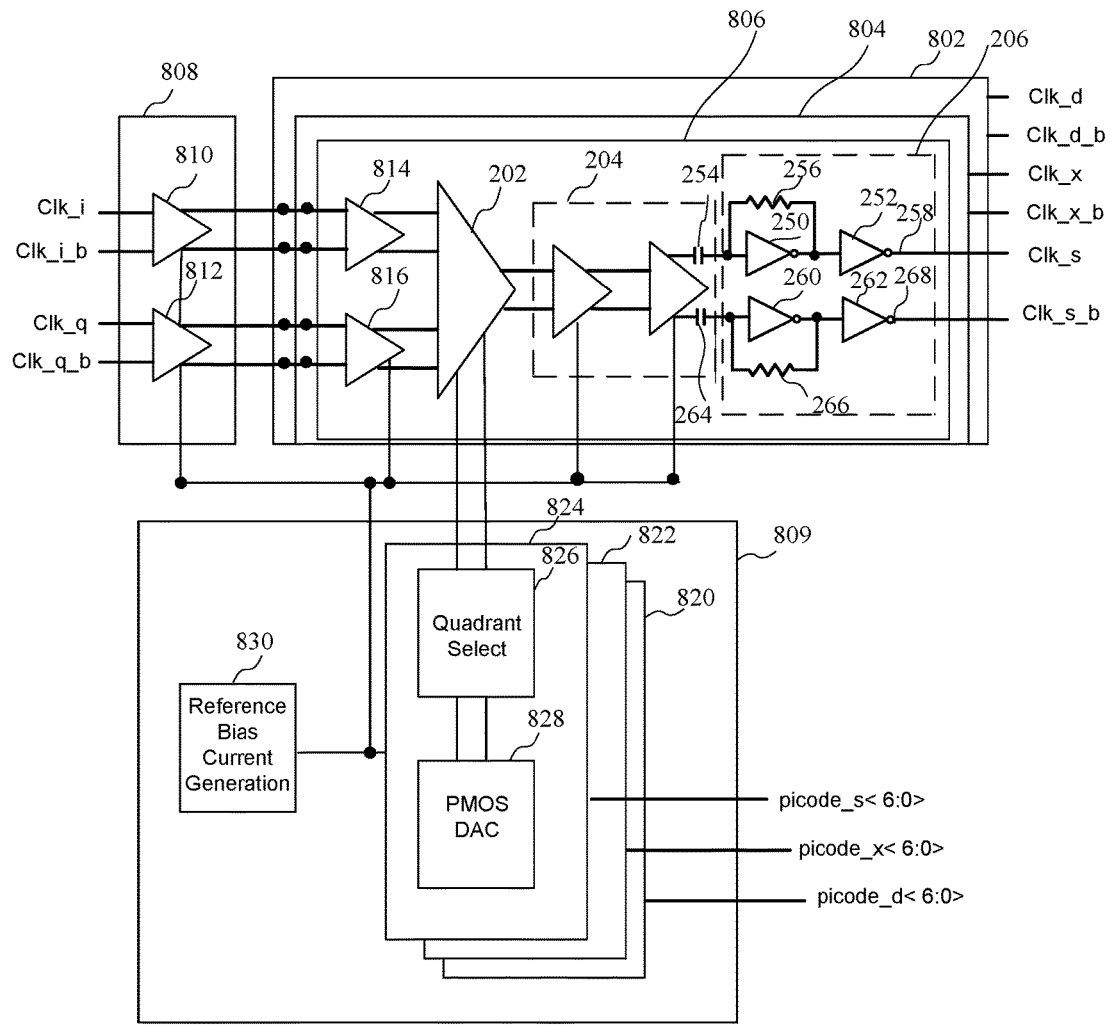
FIG. 8 is a block diagram of a phase interpolator having scan, crossing and data slices implementing a phase interpolator with an active load.

Turning now to FIG. 8, a block diagram of a phase interpolator having scan, crossing and data slices each implementing a phase interpolator with an active load is shown. The circuit of FIG. 8 includes a plurality of slices, shown here as 3 slices for scan, data and crossing. While three slices are shown, it should be understood that a greater or lesser number of slices could be implemented. While each of a first slice 802 having a phase interpolator for generating data clocks (Clk_d and Clk_d_b), a second slice 804 having a phase interpolator for generating crossing clocks (Clk_x and Clk_x_b), and a third slice 804 having a phase interpolator for generating eye scan clocks (Clk_s and Clk_s_b) are shown, only details related to the slice 806 are shown. However, it should be understood that reference clock signals generated by a clock generator 808 are provided to each of the slices 802, 804 and 806, and similar circuits as the circuits implemented in the slice 806 are implemented in the slices 802-804. A control circuit 809 provides corresponding control signals to each of the slices 802, 804 and 806.

The clock generator 808 comprises a first buffer 810 coupled to receive a first pair of differential signals Clk_i and Clk_i_b, which could be a 0 degree phase of a reference clock signal and a 180 degree phase of the reference clock signal. The clock generator 808 also comprises a second buffer 812 coupled to receive a second pair of differential signals Clk_q and Clk_q_b, which could be a 90 degree phase of the reference clock signal and a 270 degree phase of the reference clock signal. The clock signals generated by the clock generator 808 are coupled to each of the slices 802, 804, and 806.

The slice 806 comprises a pair of buffers 814 and 816 coupled to receive the pairs of differential clock signals coupled to each of the buffers 810 and 812, and provide the clock signals to the phase interpolator 202. Outputs of the phase interpolator 202 are coupled to the CML-to-CMOS converter 206.

The control circuit 809 comprises control signal generators, including a first control signal generator 820 that receives a first phase interpolator code picode_d for controlling the phase interpolator 202 of the slice 802. The control circuit 809 also comprises a second control signal generator 822 that receives a second phase interpolator code picode_x for controlling the phase interpolator 202 of the slice 804. Finally, the control circuit 809 also comprises a third control signal generator 824 that receives a third phase interpolator code picode_s for controlling the phase interpolator 202 of the slice 806. Each of the control signal generators comprises a quadrant select signal 826 with its inputs coupled to a PMOS DAC circuit 828 and its outputs phase interpolator circuit 202.

The phase interpolator is required to generate an output phase anywhere between 0° and 360° of the input clock. The phase interpolator implementation divides this range into 4 quadrants: 0°-90°, 90°-180°, 180°-270° and 270°-360°. Depending on which quadrant is selected by the input PI code, 2 different slices of the 4 slices of the mixer are active. The quadrant select block 826 sets the 4 vbias voltages to the tail currents for each of the gm transconductance pairs as appropriate for the selected quadrant. The PMOS DAC is a current DAC and generates a bias currents for the 2 active slices of the mixer in response to the picode, where the amount of phase interpolation is proportional to the relative amount of current in the 2 active slices of the mixer. Each of the control signal generators comprises a reference bias current generation block 830 that generates the reference bias current for the PMOS DAC and also for the other CML stages of FIG. 8 and the 2 inactive slices of the mixer.

Figure 9:
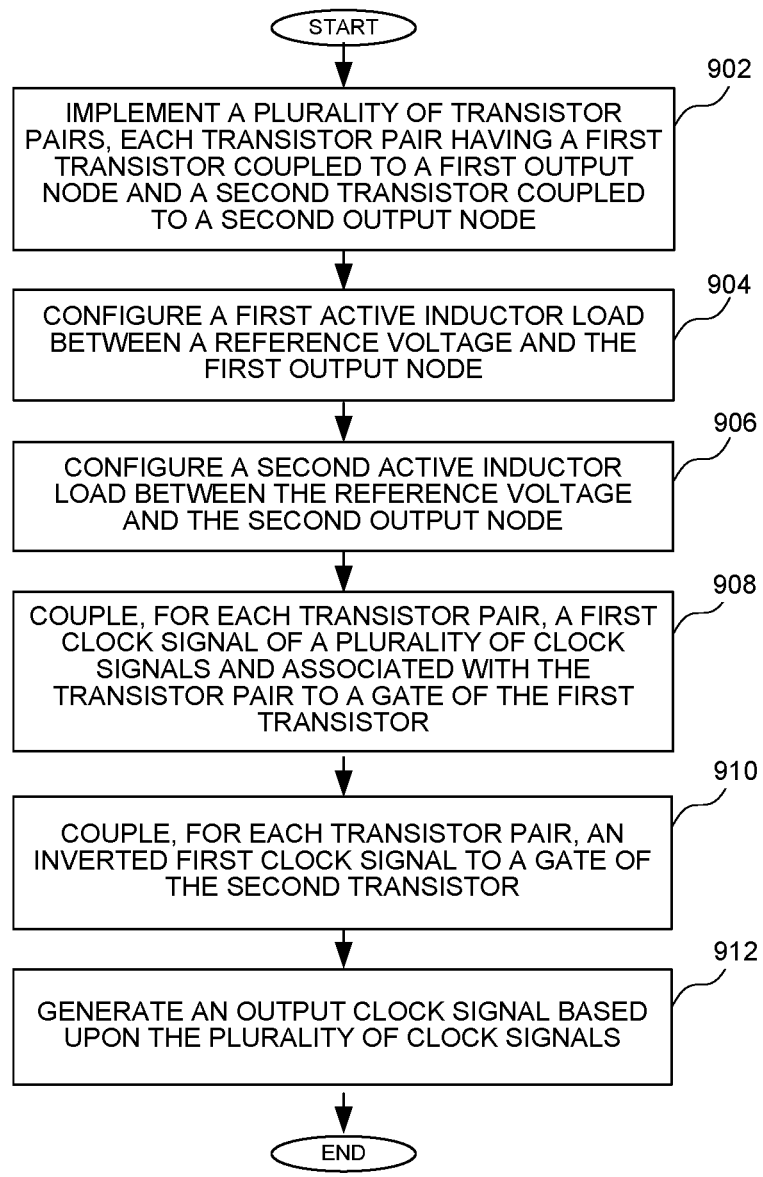
FIG. 9 is a flow chart showing a method of implementing a phase interpolator.

Turning now to FIG. 9, a flow chart shows a method of implementing a phase interpolator. It should be noted that the flow charts of FIGS. 9 and 10 could be implemented using any of the circuits of FIGS. 1-8, for example, or other suitable circuits. A plurality of transistor pairs are implemented at a block 902, where each transistor pair has a first transistor coupled to a first output node and a second transistor coupled to a second output node. The first and second transistors could be implemented as described in reference to FIG. 3, for example.

A first active inductor load is configured between a reference voltage and the first output node at a block 904. A second active inductor load is configured between the reference voltage and the second output node at a block 906. More particularly, the first active inductor load could be configured between a reference voltage and the first output node, wherein a first resistor is coupled between a gate and a source of a first transistor. The second active inductor load between the reference voltage and the second output node, wherein a second resistor is coupled between a gate and a source of a second transistor.

For each transistor pair, a first clock signal of a plurality of clock signals and associated with the transistor pair is coupled to a gate of the first transistor at a block 908. For each transistor pair, an inverted first clock signal is coupled to a gate of the second transistor at a block 910. An output clock signal is generated based upon the plurality of clock signals at a block 912.

Figure 10:
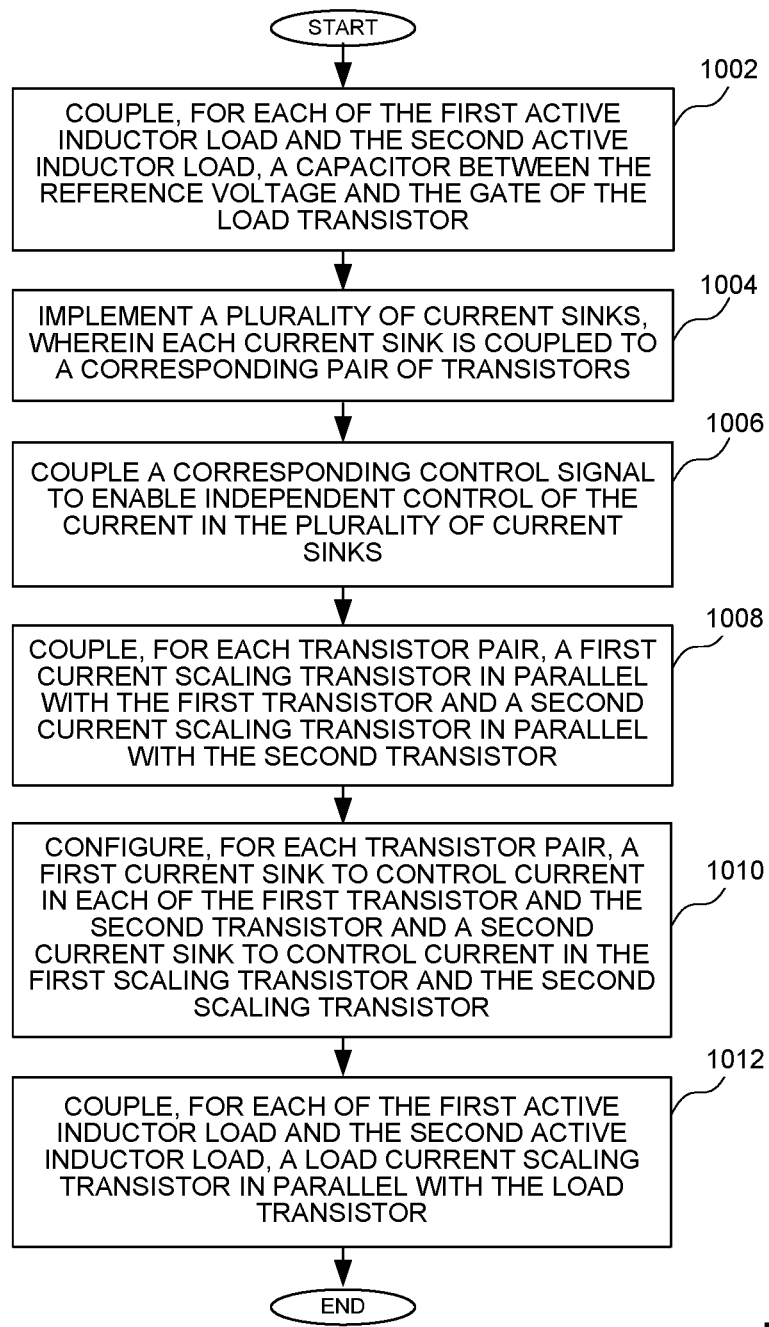
FIG. 10 is a flow chart showing a method showing additional elements implementing a phase interpolator.

Turning now to FIG. 10, a flow chart shows additional elements of implementing a phase interpolator. For each of the first active inductor load and the second active inductor load, a capacitor is coupled between the reference voltage and the gate of the load transistor at a block 1002. The capacitor could be implemented as one or more programmable capacitors implemented in FIG. 6.

A plurality of current sinks are implemented at a block 1004, wherein each current sink is coupled to a corresponding pair of transistors. A corresponding control signal is coupled to enable independent control of the current in the plurality of current sinks at a block 1006. For each transistor pair, a first current scaling transistor is coupled in parallel with the first transistor and a second current scaling transistor is coupled in parallel with the second transistor at a block 1008. For each transistor pair, a first current sink is configured to control current in each of the first transistor and the second transistor, and a second current sink is configured to control current in the first scaling transistor and the second scaling transistor at a block 1010. The current sink transistor and current scaling transistors could be implemented as described in reference to FIG. 5, for example. For each of the first active inductor load and the second active inductor load, a load current scaling transistor is coupled in parallel with the load transistor at a block 1012. The load current scaling transistors implemented with the active inductor loads could be implemented as described in reference to FIG. 7, for example.

It can therefore be appreciated that new to circuits for and methods of implementing a phase interpolator in an integrated circuit have been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A phase interpolator implemented in an integrated circuit to derive a clock signal, the phase interpolator comprising:
    a plurality of inputs coupled to receive a plurality of clock signals;
    a plurality of transistor pairs, each transistor pair having a first transistor coupled to a first output node and a second transistor coupled to a second output node, wherein a first clock signal associated with the transistor pair is coupled to a gate of the first transistor and an inverted first clock signal associated with the transistor pair is coupled to a gate of the second transistor;
    a first active inductor load coupled to the first output node;
    a second active inductor load coupled to the second output node, wherein each of the first active inductor load and the second active inductor load comprises a load transistor and a resistor coupled between a gate and a current node of the load transistor; and
    for each of the first active inductor load and the second active inductor load, a capacitor coupled between a reference voltage and the date of the load transistor.

2. The phase interpolator of claim 1 wherein the capacitor comprises a programmable capacitor that enables linearity of the phase interpolator based upon a frequency of operation.

3. The phase interpolator of claim 2 wherein, for each of the first active inductor load and the second active inductor load, the resistor is a programmable resistor, and a value of the resistor and a value of the capacitor are selectable to establish an impedance of the active inductor load.

4. The phase interpolator of claim 1 further comprising a plurality of current sinks, wherein each current sink is coupled to a corresponding pair of transistors.

5. The phase interpolator of claim 4 wherein each of the plurality of current sinks is coupled to receive a corresponding control signal to enable independent control of the current in the plurality of current sinks.

6. The phase interpolator of claim 1 wherein each transistor pair comprises a first current scaling transistor coupled in parallel with the first transistor and a second current scaling transistor coupled in parallel with the second transistor.

7. The phase interpolator of claim 6 further comprising, for each transistor pair of the plurality of transistor pairs, a first current sink configured to control current in each of the first transistor and the second transistor, and a second current sink configured to control current in the first current scaling transistor and the second current scaling transistor.

8. The phase interpolator of claim 7 wherein each of the first active inductor load and the second active inductor load comprises a load current scaling transistor coupled in parallel with the load transistor.

9. A method of implementing a phase interpolator in an integrated circuit to derive a clock signal, the method comprising:
    implementing a plurality of transistor pairs, each transistor pair having a first transistor coupled to a first output node and a second transistor coupled to a second output node;
    configuring a first active inductor load between a reference voltage and the first output node by coupling a first resistor between a gate and a source of a first load transistor;
    configuring a second active inductor load between the reference voltage and the second output node by coupling a second resistor between a gate and a source of a second load transistor;
    coupling, for each of the first active inductor load and the second active inductor load, a capacitor between the reference voltage and the gate of the load transistor;
    coupling, for each transistor pair, a first clock signal of a plurality of clock signals and associated with the transistor pair to a gate of the first transistor;
    coupling, for each transistor pair, an inverted first clock signal to a gate of the second transistor; and
    generating an output clock signal based upon the plurality of clock signals.

10. The method of claim 9 wherein the capacitor comprises a programmable capacitor, the method further comprising programming the capacitor based upon a frequency of operation.

11. The method of claim 10 wherein, for each of the first active inductor load and the second active inductor load, the resistor is a programmable resistor, the method further comprising selecting a value of the resistor and a value of the capacitor to establish an impedance of the active load.

12. The method of claim 9 further comprising implementing a plurality of current sinks, wherein each current sink is coupled to a corresponding pair of transistors.

13. The method of claim 12 further comprising coupling a corresponding control signal to enable independent control of the current in the plurality of current sinks.

14. The method of claim 9 further comprising coupling, for each transistor pair, a first current scaling transistor in parallel with the first transistor and a second current scaling transistor in parallel with the second transistor.

15. The method of claim 14 further comprising configuring, for each transistor pair, a first current sink to control current in each of the first transistor and the second transistor and a second current sink to control current in the first current scaling transistor and the second current scaling transistor.

16. The method of claim 14 further comprising coupling, for each of the first active inductor load and the second active inductor load, a load current scaling transistor in parallel with the load transistor.

* * * * *